United States Patent [19]

Okuyama et al.

[11] Patent Number: 4,939,405

[45] Date of Patent: Jul. 3, 1990

[54] PIEZO-ELECTRIC VIBRATOR PUMP

[75] Inventors: Hidenori Okuyama, Hinagahigashi; Katsumi Aoyagi, Agatagaoka, both of Japan

[73] Assignee: Misuzuerie Co. Ltd., Hinagahigashi, Japan

[21] Appl. No.: 289,625

[22] Filed: Dec. 23, 1988

[30] Foreign Application Priority Data

Dec. 28, 1987 [JP] Japan .................. 62-332600

[51] Int. Cl.$^5$ .......................................... H01L 41/08
[52] U.S. Cl. ..................... 310/330; 310/317; 310/332; 310/340; 310/345; 417/410
[58] Field of Search .............. 310/328, 330–332, 310/340, 345, 363, 317; 417/322, 410, 415, 418

[56] References Cited

U.S. PATENT DOCUMENTS

| | | | |
|---|---|---|---|
| 3,270,672 | 9/1966 | Haines et al. | 310/331 X |
| 3,361,067 | 1/1968 | Webb | 310/332 X |
| 4,140,936 | 2/1979 | Bullock | 310/331 X |
| 4,492,360 | 1/1985 | Lee et al. | 310/330 X |
| 4,708,600 | 11/1987 | Judom et al. | 310/332 |

Primary Examiner—Mark O. Budd
Attorney, Agent, or Firm—David O'Reilly

[57] ABSTRACT

A pump is comprised of a piezo-electric vibrator mounted in a casing. The piezo-electric vibrator is coated with an elastic elastomer layer, and a peripheral part of the elastomer layer is secured to the casing within the casing. Suction and discharge of fluid is performed by means of piezo-electric vibrator vibrated by applying alternative current voltages between electrodes of the piezo-electric vibrator. The vibration of the piezo-electric vibrator is performed smoothly to produce and high discharge volume and discharge pressure can be produced.

9 Claims, 3 Drawing Sheets

4,939,405

PIEZO-ELECTRIC VIBRATOR PUMP

BACKGROUND OF THE INVENTION

1. (Field of the Invention)

The present invention relates a piezo-electric vibrator pump in which suction and discharge of fluid are accomplished by the vibration of a piezo-electric vibrator formed of a piezo-electric film of a monolayer or laminate, and more particularly to a piezo-electric vibrator and a piezo-electric vibrator with an invertor of high efficiency suction non-return valve can be operated promptly according to the vibration generated by the frequency voltage produced when it is driven by an alternate current supply.

2. (Description of the Prior Art)

Referring to the usual piezo-electric vibrator pump shown in FIG. 5, the usual piezo-electric pump comprises a piezo-electric vibrator 2 mounted in a casing 1 having a peripheral part secured to casing 1 within casing 1. The piezo-electric vibrator 2 is formed of two laminated piezo-electric layers 9, 9 and electrode 3 inserted between the two piezo-electric layers 9, 9, and electrodes 4, 4 laminated on both sides of laminated two piezo-electric layers 9, 9. Lead wires 11, 12 are connected to the electrodes 3, 4. The piezo-electric vibrator pump is provided with a suction non-return valve 5 (check valve) and a discharge non-return valve 6. An alternate current voltage e is applied between the electrodes 3, 4 of said piezo-electric vibrator 2 through lead wires 11, 12 which results in vibration of said piezo-electric vibrator causing fluid to be sucked through the suction non-return valve 5 and discharged through the discharge non-return valve 6 with the vibration of the piezo-electric vibrator.

However, because of direct attachment of the piezo-electric vibrator 2 to the casing, the usual pump has many disadvantages. The vibration of the piezo-electric vibrator 2 is restricted so that the amplitude of the piezo-electric vibrator 2 becomes smaller, its performance is lower, its insulation characteristic is inferior, noise occurs due to the vibration of the piezo-electric vibrator, and in some cases stresses are imposed on the parts of the piezo-electric vibrator attached to the casing to such an extent that the piezo-electric vibrator may be broken.

Further, in the usual construction of a piezo-electric vibrator not coated with an elastic layer, piezo-electric vibrator 2, secured to a pump casing 1, is vibrated as shown in FIG. 5. That is, there is a scarcely displaced part at the peripheral part of the piezo-electric vibrator so that a dead space is formed, resulting in lower gas suction-discharge capability and lower liquid selfsuction. In order to remove such a dead space, it is conceived to lessen the clearance between the piezo-electric vibrator 2 and an inner surface of the casing 1. However, there is the possibility that the collision of the piezo-electric vibrator with the casing 1 can occur resulting in the breakdown of the piezo-electric vibrator.

BRIEF SUMMARY OF THE INVENTION

Accordingly, it is an object of the present invention to provide a piezo-electric vibrator pump having an improved insulation characteristic and higher fluid suction-discharge capability to improve the pump performance, and in which there is no possibility that the piezo-electric vibrator may be broken prolonging that its service life the problem of generation of noise is also solved.

The above object of the present invention is attained, according to the invention, by a piezo-electric vibrator pump in which a piezo-electric vibrator 2 is mounted in a casing 1 whose peripheral part is secured to and within the casing 1. The vibrator pump has a suction non-return valve 5 through which fluid is sucked from a suction line, and a discharge non-return valve 6 through which fluid is discharged to a discharge line by means of the piezo-electric vibrator 2 vibrated by applying an alternative current voltage e between electrodes 3, 4 of the piezo-electric vibrator. The piezo-electric vibrator pump has both sides of the piezo-electric vibrator 2 coated with an elastic elastomer layer 10.

In the usual piezo-electric vibrator not coated with elastic elastomer, when suction and discharge of fluid are performed by vibrating the piezo-electric vibrator 2, the disadvantages are that the amplitude thereof is small, the performance is inferior, noise occurs, and stresses are imposed on the fixed part of the vibrator so that the vibrator may be broken. On the other hand, in a piezo-electric vibrator according to the present invention which is coated with elastic elastomer layer 10, there are the advantages of layer amplitude and higher performance because the elastic elastomer layer coating the vibrator 2 is secured to and within the casing 1 so that the vibrator is suspended in the elastic elastomer. Insulation characteristics are excellent because fluid does not come directly in contact with the piezo-electric vibrator, noise is lower, and stresses are not directly imposed on the piezo-electric vibrator. Therefore the piezo-electric vibrator 2 is difficult to break because the piezo-electric vibrator 2 is not secured directly to the casing.

Further, the deformation of the elastic elastomer along the pump casing 1 results in a remarkably reduced clearance, preventing the piezo-electric vibrator from breaking by colliding with the casing. Therefore, the self-suction ability of the piezo-electric vibrator pump is improved.

The following example according to the present invention is explained in connection with the accompanying drawings.

DETAILED DESCRIPTION OF THE INVENTION

Figure 1:
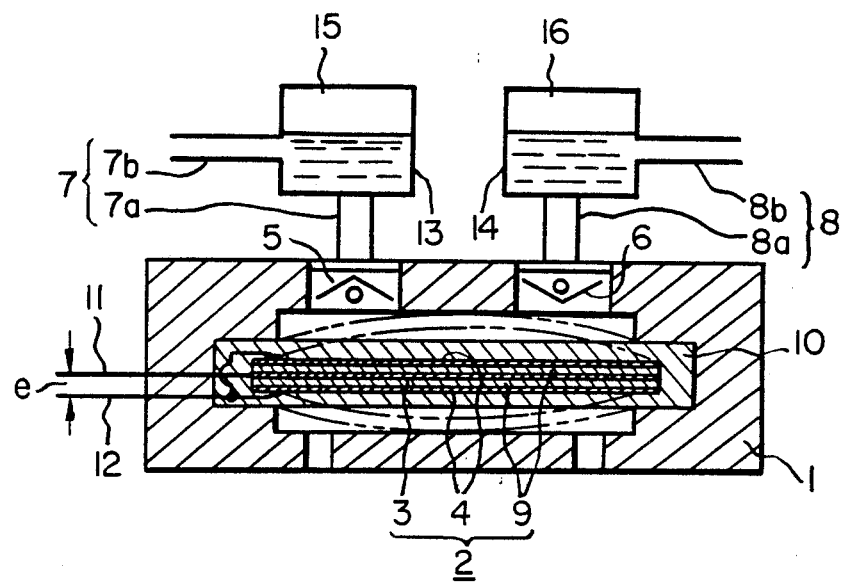
FIG. 1 a sectional view showing a first embodiment of a piezo-electric vibrator pump according to the present invention.

FIG. 1 is a sectional view showing one example of a piezo-electric vibrator pump.

In FIG. 1, casing 1 has a piezo-electric vibrator 2 and the peripheral part of the piezo-electric vibrator 2 fixed to the casing 1. The piezo-electric vibrator 2 may be a piezo-electric vibrator of the laminate type in which piezo-electric bodies are laminated on both outer sides of a shim such as a phosphor bronze, or a piezo-electric vibrator of the monolayer type such as ceramic, polymer piezo-electric materials, provided with thin film electrodes 3, 4.

In this example, the piezo-electric vibrator 2 is one of the laminate type in which two piezo-electric films 9, 9 are laminated and electrodes 4, 4 are laminated on both outer sides of the laminated two piezo-electric film 9, 9 while another electrode 3 is inserted between the two piezo-electric films 9, 9.

The casing 1 is provided with a suction line 7 and a discharge line 8 on one side of the casing enclosing piezo-electric vibrator 2. The suction line 7 and the discharge line 8 are connected with the space within the casing 1 through a suction non-return valve 5 and a discharge non-return valve 6, respectively. A non-return valve having a ball moved against a spring with fluid flowing in one direction so that the valve is opened, and a non-return valve of umbrella type having an umbrella deformed against its elastic force with fluid flowing in one direction so that the valve is opened, or the like can be used as the suction non-return valve 5 and the discharge non-return 6 respectively.

Further the suction line 7 and the discharge line 8 are provided with surge tanks 13, 14, respectively. The bottom part of the surge tanks 13, 14 are connected with one suction line 7a and one discharge line 8a, respectively, while the side walls at the middle height of the surge tanks 13, 14 are connected with another suction line 7b and another discharge line 8b, respectively.

There are spaces 15, 16 at the upper part in the surge tank 9, 10.

Preferably the surge tanks 13, 14 are arranged as close to the suction non-return valve 5 and the discharge non-return valve 6 as possible. Generally the distance between the surge tanks 13, 14 and the non-return valve 5, 6, is less than 50 mm, preferably less than 30 mm, and more preferably less than 20 mm.

The surge tanks 13, 14 makes fluid easily to move by vibration of piezo-electric vibrator 2, which results in exact movement of the non-return valves, thus increasing the pump discharge ability or the pumpability.

Further both sides of the piezo-electric vibrator 2, including the part held in an casing 1, is covered with the elastic elastomer having a modulus of londitudinal elasticity of less than $5 \times 10^8$ dyn/cm$^2$, preferably of less than $2.0 \times 10^8$ dyn/cm$^2$, and more preferably $1.5 \times 10^8$ dyn/cm$^2$.

As an elastomer, the elastic material can be silicone rubber, urethane rubber, natural rubber, SBR (styrenebutadiene rubber), cloroprene rubber, Neoprene(Trade mark of du Pont for cloroprene rubber), NBR(nitrile rubber), SBS(styrenebutadienestyrene copolymer), hydrogenated SBR, fluorosilicone rubber, fluoroelastomer, EPR(ethylene propylene rubber), ethylene vinylacetate copolymer or the like.

When A C voltage e is applied between electrodes 3, 4 the piezo-electric vibrator 2 is vibrated in a direction perpendicular to the surfaces of the piezo-electric vibrator 2, that is up and down as shown in FIG. 1. When the piezo-electric vibrator 2 bends downwards, the pressure on the inside of the piezo-electric vibrator pump is reduced to the negative pressure by which discharge non-return valves 6 is closed while the suction non-return valve 5 is opened so that fluid is sucked into the piezo-electric vibrator pump through the suction non-return valve 5. On the other hand, when the piezo-electric vibrator 2 bends upwards, the pressure on the inside of the piezo-electric vibrator pump is increased to a positive pressure closing suction non-return valve 5 and, discharge non-return valve 6 opens so that fluid is sucked in and discharged from the piezo-electric vibrator pump through the discharge non-return valve 6. Further the suction and discharge of fluid is performed with the vibration of the piezo-electric vibrator 2.

Under the condition that the suction and discharge of fluid is performed with the vibration of the piezo-electric vibrator 2 to which A C voltage e is applied, coating the piezo-electric vibrator 2 with the elastic elastomer 10 results in an improvement of the lifetime and performance of the pump and an increase of uses for the pump.

When the piezo-electric vibrator 2 not covered with elastic elastomer 10, the disadvantages that insulation characteristics are worse, because of the small amplitude the pump performance is lower, and because the piezo-electric vibrator 2 is fixed direcly to the casing 1, stresses are imposed on the supported part of the piezo-electric vibrator so that the piezo-electric vibrator 2 may break easily and noise is made.

However, when the piezo-electric vibrator is coated with the elastic elastomer 10, insulation characteristics improve, and the amplitude of the piezo-electric vibrator increases because the piezo-electric vibrator 2 is suspended in the elastic elastomer 10. Thus pump performance is improved. According to the invention, the piezo-electric vibrator 2 is not fixed directry to casing 1, but elastic elastomer 10 is fixed to the casing 1, stresses being difficult to impose on the supported part of the elastomer 10 by the casing 1. Therefore, the piezo-electric vibrator will be not broken, and noise will be difficult to make.

Further, it becomes possible to flow many sorts of fluid, by laminating many types of plastic films on the elastic elastomer 10 with which the piezo-electric vibrator 2 is covered.

In order to demonstrate the effect of the pump according to the invention experiments were made comparing an example of the piezo-electric vibrator coated with the elastomer according to the invention with a comparison of the piezo-electric vibrator which is conventionally not coated, under the same conditions with respect to self-suction ability, pressure, and flow. The results are shown in the following table.

| | Self-suction ability(mm) | | Pressure (kg/cm) | | Flow (ml/min) | |
|---|---|---|---|---|---|---|
| | liquid | gas | liquid | gas | liquid | gas |
| Comparison | 50 | — | 0.05 | 0.02 | 80 | 500 |
| Example | 900 | — | 0.20 | 0.11 | 400 | 1000 |

From the results of the experiment, it is obvious that pump performance is improved by covering the piezo-electric vibrator 2 with elastomer.

As above-mentioned, the pump according to the invention has advantages of improved insulation characteristics, improved suction and discharge ability of fluid so that pump performance is improved. There is no danger of the piezo-electric vibrator being broken because stress is difficult to impose on the supported part of the piezo-electric vibrator by the casing, the lifetime can be lengthend, and also the problem of noise can be almost dissolved.

According to the invention, plural piezo-electric vibrators of monolayer type or laminate type may be used and insulating elastomer film(s) may be inserted between the plural piezo-electric vibrators.

Figure 2:
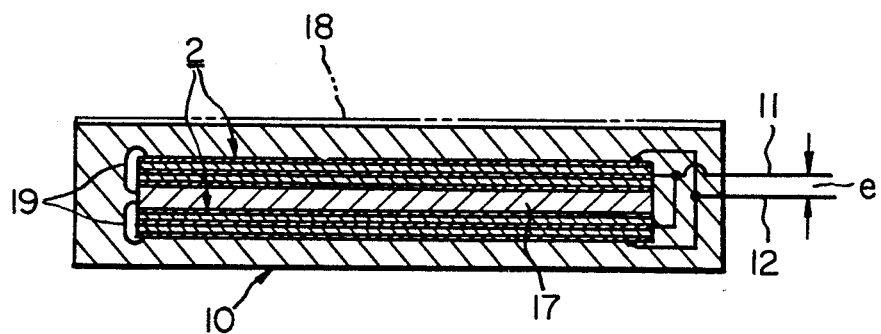
FIGS. 2 and 3 are sectional views of piezo-electric vibrators for second and the third examples according to the present invention, respectively.
Figure 3:
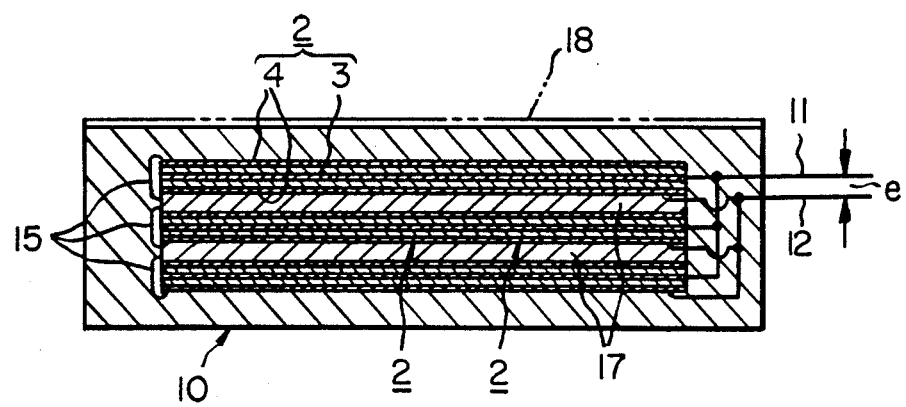
Figure 5:
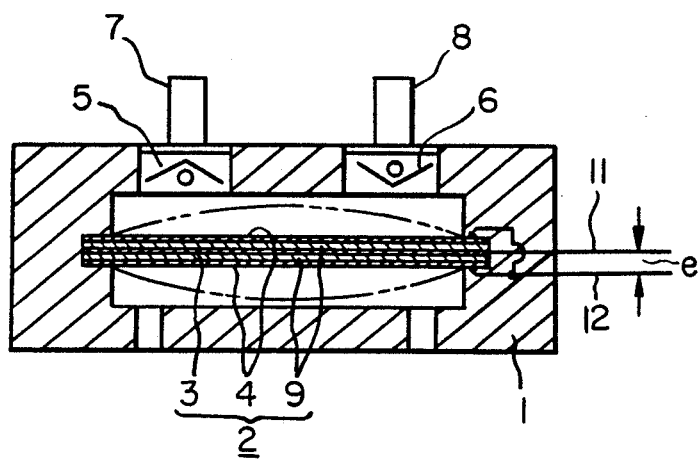
FIG. 5 is a sectional view showing one example of a prior art usual pump.

FIGS. 2 and 3 are sectional views respectively showing two piezo-electric vibrators in which an elastic elastomer film 17 is inserted between the laminated piezo-electric vibrators, and a laminate of three piezo-electric vibrators in which two elastic vibrators, with electrodes 3, 4 of respective laminates of piezo-electric vibrators 2 being connected in parallel with lead wires. Liquid-impermeable film 18 is laminated on the surface of the elastomer 10 with which the piezo-electric vibrator 2 is covered, and connecting part 19 is for connecting electrodes 4, 4 of the respective piezo-electric vibrator 2.

As elastomer films 17, elastic materials such as elastic rubbers, plastics, metals or the like. Preferably an elastic material with a coefficient of thermal conductivity as high as possible is applied as elastomer films 17 with a view to facilitating cooling of the piezo-electric vibrator 2. However, in the laminate of two piezo-electric vibrators (FIG. 2), the radiation of the piezo-electric vibrator 2 can be neglected as one side of the piezo-electric vibrator 2 is in contact with the elastomer 10.

The thickness of the elastomer film is about 0.1-5 mm, and preferably about 0.3-2 mm.

The phases of A C voltage e applied between electrodes 3, 4 of the respective piezo-electric vibrators are the same as the electrodes 3, 4 of the respective vibrators are connected in parallel with lead wires so that the function and the effect of the pump can be attained in the same manner as in the above mentioned first example. However, when laminates of piezo-electric vibrators 2 over two layers are used, higher pump performance can be attained.

It is preferable to use conductive material as the elastomer film 17, because film 17 serves both as the elastic material and as the electric connection between respective piezo-electric vibrators 2.

When the laminate of plural piezo-electric vibrators 2 are laminated with interposed elastomer film(s) they are oscillated up and down in the direction perpendicular to the surface of the respective piezo-electric vibrator 2. In this case, it is necessary to freely bend elastomer(s) interposed between each respective piezo-electric vibrator 2 and adhered to each respective piezo-electric vibrators 2 in such a way that the elastomer film(s) 17 can not prevent the piezo-electric vibrator 2 from bending. Further, it is necessary to avoid deforming the elastomer film(s) in the direction of the thickness in order to effectively take out the displacement and the forces generated in respective piezo-electric vibrator 2 to the outer areas of the elements.

For this purpose, it is desirable that the both sides of the elastomer(s) 17 are provided with many ribs which intersect either lengthwise or crosswise.

Further, it is possible to make the elastomer film(s) serve both as the transmitting means of stress generated in respective elastomer film(s) and as the electric connection between electrodes of the piezo-electric vibrators, by giving conductivity to the elastomer film(s) by mixing metal powder such as aluminum, or conductive carbon black with the elastomer material.

The pump according to the invention can be driven with commercial electric source. When the commercial electric source is used the pump driving force can be controlled to control the discharge of fluid by controlling the voltage of the electric source through a transformer or variable resistance.

Further, the pump according to the invention can be driven by a D C electric source as occasion demands. For example when the pump according to the invention is applied to a portable apparatus the pump according to the invention can be driven with the following inverter.

Figure 4:
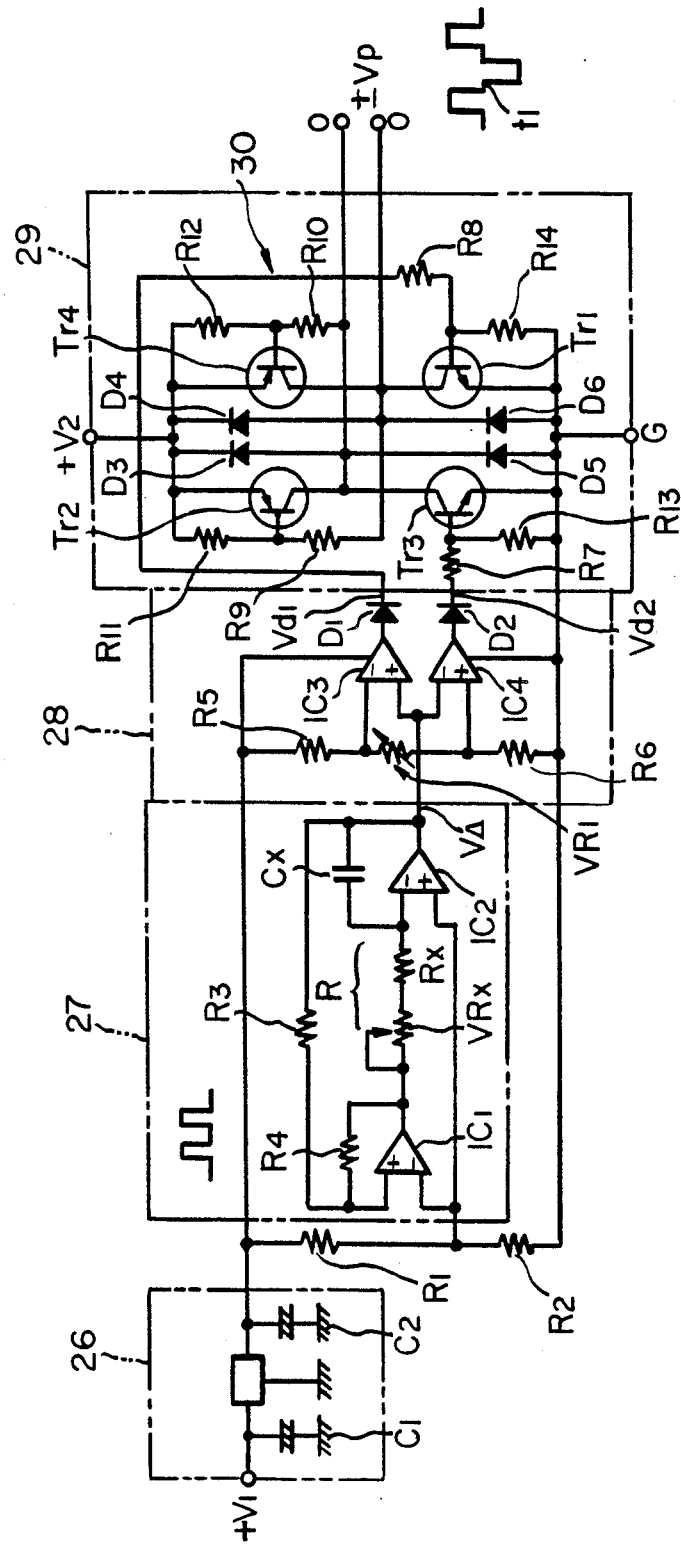
FIG. 4 is a circuit diagram showing one example of an inverter with which a piezo-electric vibrator pump according to the present invention is provided.

FIG. 4 is a circuit diagram showing an example of an inverter driving the pump according to the invention. Constant-voltage circuit 26 for transforming the voltage $V_1$ of the D C electric source input to the constant-voltage circuit into constant-voltage (3 terminal regulator), can be omitted. Oscillation circuit 27 to which D C voltage V is output with oscillations according to the time constant of capacitor Cx and resistor (CR=VRx+Rx) with the following frequency:

$$f = \frac{1}{2\,Cx\,(VRx + Rx)}.$$

In the example shown in FIG. 4, a triangular wave is oscillated and triangular wave voltage V△ is output. The oscillation circuit 27 comprises a square wave generating division circuit including a comparator IC element $IC_1$ and resistors $R_3$, $R_4$, a triangular wave generating division circuit including a capacitor Cx transforming square wave voltage output from square wave generating division circuit into a triangular wave voltage, a resistor R, and a comparator IC element $IC_2$. The triangular wave generating division circuit is called a Miller integrating circuit. In this example, the triangular wave generating division is designed so that oscillation frequency f can be altered by changing the resistance value of a variable resistor VRx. Resistors $R_1$, $R_2$ are for dividing D C voltage $V_1$.

The potential dividing point (connecting point) of resistor $R_1$, $R_2$ is connected to a negative terminal of the comparator IC element $IC_1$ and the positive terminal of the comparator IC element $IC_2$. The resistor $R_4$ is connected between the positive terminal of and the output terminal of the comparator IC element $IC_1$, while the resistor $R_3$ is connected between the positive terminal and the output terminal of the comparator IC element $IC_2$.

The series circuits of the variable resistor VRx and the resistor Rx are connected between the output terminal of the IC element $IC_1$ and the negative terminal of the IC element $IC_2$, while the capacitor Cx is connected between the negative terminal and the output of the IC element $IC_2$.

Therefore the square wave generating division of the oscillating circuit 27 is operated with the voltage of capacitor Cx, thereby the square wave voltage is output from the output terminal of IC element $IC_1$, the square wave voltage is input to the triangular wave generating division circuit so that triangular wave voltages are integrated, and the triangular wave voltage V△ is output from the output terminal of the IC element $IC_2$.

Numeral 28 designates a driving circuit receiving the output of the oscillating circuit 17 and from which after the quiescent period $t_1$, two operating signals $Vd_1$, $Vd_2$ with operating times different from each other are output. The driving circuit comprises a comparator IC element $IC_3$, which operates during the period of a positive wave of the triangular wave voltage V△, a comparator IC element $IC_4$ which operates during the period of negative wave of the triangular wave wave voltage V, resistors $R_5$, $R_6$, a variable resistor VR for adjusting the pulse quiescent period and diodes $D_1$, $D_2$.

The series circuit of the resistor $R_5$, the variable resistor $VR_1$ and the resistor $R_6$ is connected between the DC voltage line and the earth line. The connecting point of the resistor $R_5$ and the resistor $R_4$ is connected to the positive terminal of the IC element $IC_4$. The positive terminal of the IC element $IC_3$ and the negative terminal of the IC element $IC_4$ are connected with each other and are connected to the output terminal of the IC element $IC_2$ of the triangular wave oscilating circuit 17. Diodes $D_1$, $D_2$ anode side is connected to the output terminals of the IC elements $IC_3$, $IC_4$, respectively.

Pulse generating circuit 29 receives the output from IC elements $IC_3$, $IC_4$ to convert DC voltage $V_2$ into positive and negative pulse voltages $\pm Vp$. The pulse generating circuit 29 comprises the bridge circuit 30 including npn, pnp transistors $Tr_1$, $Tr_2$ respectively on oposing lines and npn, pnp transistors $Tr_3$, $Tr_4$ on other opposing lines. Transistors $Tr_1$, $Tr_2$ and transistors $Tr_3$, $Tr_4$ are alternately switched on and off, respectively. The bridge circuit 30 is designed, as hereinafter described in detail so that positive and negative pulse voltages $\pm Vp$ having a quiescent period $t_1$ can be alternately obtained between the output terminals of the bridge circuit 30 by applying DC voltage $V_2$ between the voltage terminals of the bridge circuit 30.

That is, resistors $R_{14}$, $R_{15}$ are connected between the base and emitter of npn transistor $Tr_1$ on one line of the opposing lines, and between the base and emitter of npn transistor $Tr_3$ on one line of the other opposing lines, respectively. The respective emitters are connected to earth. Resistors $R_8$, $R_7$ are connected between the bases of the respective transistors $Tr_1$, $Tr_2$ and the diodes $D_1$, $D_2$, while diodes $D_5$, $D_6$ are connected between the collectors and the emitters of transistors $Tr_3$ and $Tr_1$.

Resistors $R_{11}$, $R_{12}$ are connected between base and emitter of the npn transistor $Tr_2$ on the other line of the opposing lines and between base and emitter of the pnp transistor $Tr_4$ on the other line of yet another opposing lines, respectively. The respective bases are connected to voltage terminal $V_2$ through resistors $R_{11}$, $R_{12}$. Resistors $R_9$, $R_{10}$ are connected between the respective bases and the collectors of the npn transistors $Tr_1$, $Tr_3$, while diodes $D_3$, $D_4$ are connected between the respective collectors and the respective voltage terminals $V_2$.

Further, the collector of the npn transistor $Tr_1$ on one of the opposing lines is connected to the collector of the other pnp transistor $Tr_4$, and the collector of the npn transistor $Tr_3$ of one line of another opposing two lines is connected to the collector of the other pnp transistor $Tr_2$.

Therefore, in pulse generating circuits 29, during a positive slope of triangular voltage $V\Delta$ the comparator IC element $IC_3$ functive to produce signal $Vd_1$ which is sent to earth (ground) through the diode $D_1$, the resistor $R_8$, and the resistor $R_{14}$, the npn transistor $Tr_1$ change to an on-state with the signal on resistor $R_{14}$, thus electric current is sent from voltage terminal $V_2$ to earth through the resistors $R_{11}$, $R_9$ and the collector of the npn transistor $Tr_1$, changing the pnp transistor $Tr_2$ to an on-state by the voltage on the resistor $R_{11}$. Thereby, positive pulse voltage $+Vp$ is obtained from the output terminals 0 which is connected to the collector of the pnp transistor $Tr_2$.

Further, during the negative slope of thee triangular wave voltage $V\Delta$ the comparator IC element $IC_4$ functive to produce signal $Vd_2$ which is sent to the earth through the diode $D_2$, the resistor $R_7$, and $R_{13}$. The npn transistor $Tr_3$ is changed to an on-state, thereby electric current is sent from the voltage terminal $V_2$ to the earth through the resistors $R_{12}$, and $R_{10}$, and the collector and the emitter of npn transistor $Tr_3$. The pnp transistor $Tr_4$ is changed to an on-state by the voltage on the resistor $R_{12}$. Thereby, negative pulse voltage $-Vp$ can be obtained at the output terminals 0 connected to the collector of the pnp transistor $Tr_4$.

The positive and negative pulse voltage $\pm Vp$ can be freely changed by changing the DC voltage $V_1$. Thus, by connecting the output terminal to the piezo-electric vibrator pump as shown in FIGS. 1 to 3, it is possible to work the pump with the positive and negative pulse voltage $\pm Vp$ with voltage values adjusted to the pump. It is not necessary to elaborate but the positive and negative pulse voltage $\pm Vp$ can be held constant by holding the input constant.

The oscillation frequency of the triangular wave voltage $V\Delta$ can be freely changed by changing the value of the variable resistor $VRx$. Further the triangular wave voltage $V\Delta$ can be converted into a sine wave voltage by passing the positive and negative pulse voltages $\pm Vp$ generated at the output terminals of the pulse generating circuit 29 through a filter.

It being obvious from the hereinabove description, the following is possible, according to the invention:

(1) the positive and negative pulse voltage DC output voltages $\pm Vp$ can be freely changed by changing the voltage of the DC power source (DC input voltage) $V_1$, thus the piezo-electric vibrator pump can be operated:

(2) the positive and negative pulse voltages $\pm Vp$ can be held constant by stabilizing the DC power source, thus the operation of the piezo-electric vibrator pump can be stabilized;

(3) the output frequency adjusted for the piezo-electric vibrator pump can be set by changing the time constant and the oscillation frequency, therefore the frequency adjustment for the piezo-electric vibrator pump can be made so that maximum efficiency is achieved.

(4) the piezo-electric vibrator pump can be operated with maximum electric power rather than with a conventional sine wave output voltage as positive and negative pulse voltages $\pm Vp$ can be obtained;

(5) the invertor can be simple and smaller and of low-cost construction as a switching element with a gate is not used;

(6) the power consumption can be reduced and accidents almost eliminated as compared with the conventional device in which an output voltage is changed as the positive and negative pulse voltages $\pm Vp$ are changed by changing the DC input voltage $V_1$; and (7) on-off states of the npn transistors and pnp transistors $Tr_1$, $Tr_2$, $Tr_3$, and $Tr_4$ can be positively switched on and off even if the frequency and switching speed becomes higher with the two output operation signals $Vd_1$, $Vd_2$ with the pulse quiescent period $t_1$ of the driving circuit 28 to which the output triangular wave voltage $V\Delta$ of the triangular wave oscilation circuit 27 is input and from which two operation signal $Vd_1$, $Vd_2$ whose operating points are different from each other are output after the quiescent period $t_1$. Therefore, the four transistors are not at all, if transiently, short-circuited and there is no possibility of overheating damage, and also the pump can be operated with alternately output positive and negative pulse voltages $\pm Vp$ with a pulse quiescent period $t_1$ from the output terminal.

From the hereinabove recited reason, the above-mentioned invertor is suitable for driving an electric power source for a piezo-electric vibrator pump, and therefore, the piezo-electric vibrator pump itself with the invertor according to the invention.

We claim:

1. A piezo-electric vibrator pump comprising; at least one piezo-electric vibrator mounted in a casing having a peripheral part secured to a portion of said casing, a suction non-return valve through which fluid is sucked from a suction line and a discharge non-return valve through which the fluid is discharged from a discharge line by means of a piezo-electric vibrator vibrated by applying an alternative current voltage between electrodes of said piezo-electric vibrator, said suction and discharge non-return valves both being in said casing wall and on the same side of said piezo-electric vibrator; said piezo-electric vibrator pump having both sides of the piezo-electric vibrator coated with elastic elastomer layers of approximately 0.8 to 10 mm thickness; said elastic elastomer layers having a modulus of longitudinal elasticity of less than about $5 \times 10^8$ dynes/cm$^2$.

2. A piezo-electric vibrator pump as claimed in claim 1 wherein the elastomer layer has a thickness in the range of 1.0 to 5.0 mm.

3. A piezo-electric vibrator pump according to claim 1 wherein the elastomer layer comprises an elastomer selected from the group consisting of silicone rubber, urethane rubber, Neoprene, NBR, SBR, chloroprene, silicone fluoride rubber, and ethyrene propyrene rubber, 4. A piezo-electric vibrator pump according to claim 1 wherein said suction line and said discharge line are each provided with a surge tank having a space at a respective upper part near said suction non-return valve and said discharge non-return valve respectively.

5. A piezo-electric vibrator pump according to claim 1 wherein said piezo-electric vibrator comprises plural piezo-electric vibrators of a monolayer or laminate type and wherein said elastic elastomer thin layers are inserted between each of said piezo-electric vibrators of monolayer or laminate type.

6. A piezo-electric vibrator pump according to claim 5 wherein said elastomer thin layers have a thickness of approximately 1.0 to 5.0 mm.

7. A piezo-electric vibrator pump as claimed in claim 5 wherein said elastic elastomer thin layers are conductive.

8. A piezo-electric vibrator pump according to claim 1 in which said piezo-electric vibrator pump includes an inverter having an oscillating circuit receiving a direct current input so that the oscillation at a given frequency can be produced and from which a wave form voltage is output, a drive circuit receiving an output from said oscillating circuit and from which two operating signals having different operating points respectively are input at intervals of a quiescent period term and a pulse generation circuit having positive and negative pulse voltages are alternately generated according to two operating signals output from said drive circuit, said piezo-electric vibrator pump being driven by the output of said inverter.

9. A piezo-electric vibrator pump according to claim 1 in which said piezo-electric vibrator pump includes an inverter having an oscillating circuit receiving a direct current input so that oscillation at a given frequency can be produced and from which a wave form voltage is output, a drive circuit receiving an output from said oscillating circuit and from which two operating signals having different operating points respectively are input at intervals of a quiescent period and a pulse generation circuit in which positive and negative pulse voltage are alternately generated according to the two operating signals output from said drive circuit, said pulse genaration circuit including a bridge circuit comprises of an npn transistor and a pnp transistor arranged on two opposed sides respectively and a second npn transistor and pnp transistor arranged on opposite sides respectively wherein said npn transistors and said pnp transistors on respective opposite sides are connected so that said bridge circuit is formed having said npn transistors and pnp transistors alternately changed to on and off states, said two operating signals being applied to the two input terminals of said bridge circuit respectively, whereby a direct current is applied between the voltage terminals thereof and plus and minus pulse voltages with a pulse quiescent period is alternately obtained from the output terminals thereof, the output of said inverter being applied between electrodes of said piezo-electric vibrator.

* * * * *